(12) United States Patent
Matsui

(10) Patent No.: US 8,378,236 B2
(45) Date of Patent: Feb. 19, 2013

(54) ELECTRIC JUNCTION BOX

(75) Inventor: Toshiyuki Matsui, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 335 days.

(21) Appl. No.: 12/888,597

(22) Filed: Sep. 23, 2010

(65) Prior Publication Data
US 2011/0100706 A1   May 5, 2011

(30) Foreign Application Priority Data

Nov. 5, 2009   (JP) ................................. 2009-254453

(51) Int. Cl.
*H05K 7/02* (2006.01)

(52) U.S. Cl. ...................................... 174/541; 439/76.2
(58) Field of Classification Search .................. 174/535, 174/541; 439/76.2
See application file for complete search history.

(56) References Cited

U.S. PATENT DOCUMENTS

| | | | |
|---|---|---|---|
| 5,362,242 A | 11/1994 | Nakamura | |
| 5,707,243 A * | 1/1998 | Endo et al. | 439/76.2 |
| 6,404,628 B1 * | 6/2002 | Nagashima et al. | 361/690 |
| 6,524,113 B1 | 2/2003 | Oka | |
| 6,533,604 B2 | 3/2003 | Kobayashi et al. | |
| 6,635,824 B1 | 10/2003 | Oka | |
| 6,712,623 B2 | 3/2004 | Sumida | |
| 6,737,578 B2 * | 5/2004 | Higuchi | 174/50 |
| 6,796,808 B2 | 9/2004 | Hosoe et al. | |
| 6,808,397 B2 * | 10/2004 | Kondo | 439/76.2 |
| 6,929,489 B2 | 8/2005 | Asao et al. | |
| 6,997,721 B2 | 2/2006 | Shirota | |
| 7,074,053 B2 * | 7/2006 | Kawakita et al. | 439/76.1 |
| 7,118,390 B2 | 10/2006 | Kita | |
| 7,153,145 B2 | 12/2006 | Sekido | |
| 7,160,118 B2 | 1/2007 | Shirota | |
| 7,168,962 B2 | 1/2007 | Yomura | |
| 7,333,337 B2 | 2/2008 | Kita | |
| 7,335,035 B2 | 2/2008 | Shirota | |
| 7,381,065 B2 * | 6/2008 | Ikeda et al. | 439/76.2 |
| 7,566,249 B2 | 7/2009 | Okada | |
| 8,035,040 B2 * | 10/2011 | Nishikawa | 174/541 |
| 8,063,319 B2 * | 11/2011 | Miyamoto | 174/541 |
| 2008/0153339 A1 | 6/2008 | Suzuki et al. | |
| 2010/0202120 A1 | 8/2010 | Kita | |
| 2010/0203746 A1 | 8/2010 | Kita | |
| 2010/0300722 A1 | 12/2010 | Kita | |

FOREIGN PATENT DOCUMENTS

| | | |
|---|---|---|
| JP | 8-78076 | 3/1996 |
| JP | 10-257643 | 9/1998 |
| JP | 10-322855 | 12/1998 |
| JP | 2001-45630 | 2/2001 |
| JP | 2005-253158 | 9/2005 |

OTHER PUBLICATIONS

U.S. Appl. No. 12/878,410 to Toshiyuki Matsui, which was filed on Sep. 9, 2010.

* cited by examiner

*Primary Examiner* — Hung Ngo
(74) *Attorney, Agent, or Firm* — Greenblum & Bernstein P.L.C.

(57) ABSTRACT

A vertical bus bar is provided to a side of a relay mount portion. A flat bus bar portion is integrally provided extending from an end edge portion of the vertical bus bar to an opening of a terminal connection hole of the relay mount portion. A plurality of connection terminals, including a connection terminal for a switch, are integrally provided to the flat bus bar portion.

3 Claims, 9 Drawing Sheets

ELECTRIC JUNCTION BOX

CROSS-REFERENCE TO RELATED APPLICATIONS

The present application claims priority under 35 U.S.C. §119 of Japanese Application No. 2009-254453, filed on Nov. 5, 2009, which is herein expressly incorporated by reference in its entirety.

BACKGROUND OF THE INVENTION

1. Field of the Invention

The present invention relates to an electric junction box mounted to a vehicle and the like, particularly relates to an electric junction box provided with a relay mount portion and a bus bar for conduction with the relay mount portion.

2. Description of Related Art

Electric junction boxes, such as relay boxes, fuse boxes, and the like, are conventionally used in vehicles and the like, in order to improve efficiency of electric wiring and maintenance performance. Electrical components, such as relays, fuses, and the like, and conducting members, such as bus bars and the like, are appropriately mounted to an electric junction box. Electric power from a battery and the like is thus supplied to vehicle electrical components.

An electric junction box to which a relatively large electric current is supplied, such as a relay block and the like provided proximate to a battery, has a relatively wide bus bar as a conducting member. In order to mount a wide bus bar while preventing enlargement of the electric junction box, a vertical bus bar is conventionally employed, the vertical bus bar being housed perpendicular to a surface to which a mount portion for electrical components, such as a relay and a fuse, is provided. Such a vertical bus bar is disclosed in Japanese Patent Laid-open Publication No. 2005-253158, for instance.

When the vertical bus bar as described above is employed, however, it is unavoidable that a housing portion of the vertical bus bar is significantly projected externally on a rear side of the mount portion for electrical components, and thus it is difficult to ensure a work space. Specifically, a second end side of terminal connection holes is provided open on the rear side of the mount portion for electrical components, the holes being inserted with terminals of the electrical components to a first end side thereof. When the housing portion of the vertical bus bar is provided projecting proximate thereto, the housing portion of the vertical bus bar interferes when connection terminals of external wires are inserted to the terminal connection holes, thus making the insertion work difficult.

When two fuses are provided adjacently, it is proposed that housing portions of vertical bus bars be provided on both external sides of two fuse mount portions, as shown in FIG. 3 of Japanese Patent Laid-open Publication No. 2005-253158, and thereby a work space is ensured for connection of external terminals to terminals on both internal sides.

The structure above is effective in a case in which fuses having two terminals are provided adjacently. It is difficult, however, to apply the structure to a relay having numerous terminals. Particularly in case of the relay having numerous terminals, a terminal requiring a large electric current input is sometimes provided in a middle portion of a projected surface of relay terminals. When the housing portion of the vertical bus bar is provided to the middle portion of the projected surface of the relay terminals in order to supply power to the terminal in the middle portion, the work space for connection to terminals provided nearby is thus significantly limited.

SUMMARY OF THE INVENTION

In view of the above, the present invention provides an electric junction box having a new structure having a vertical bus bar that constitutes a specific connection terminal in a relay mount portion and capable of ensuring a large work space for mounting other connection terminals.

A first aspect of the present invention provides an electric junction box having a relay mount portion, in which the relay mount portion is provided with a plurality of terminal connection holes in which relay terminals are inserted to first openings and connection terminals are inserted to second openings, and thereby connection is made to the relay terminals. A vertical bus bar is provided to a side of the relay mount portion; a flat bus bar portion is integrally provided extending from an end edge portion of the vertical bus bar to the second openings of the terminal connection holes; and a plurality of connection terminals are integrally provided to the flat bus bar portion, the connection terminals including a connection terminal for a switch.

According to the present invention, the vertical bus bar is provided to the side, not a middle portion, of the relay mount portion. A wide work space can thus be ensured on the second opening side of the terminal connection holes of the relay mount portion. In addition, the flat bus bar portion is extended from the vertical bus bar provided to the side. Power supply to the relay terminals from the vertical bus bar can thus be achieved without the bus bar significantly projecting from the second opening side of the terminal connection holes. As a result, a spacious work space can be ensured, and connection terminals of external wires can easily be inserted to the terminal connection holes with no projection of the bus bar proximate to the work space.

In addition, the flat bus bar portion is provided extending from the end edge portion of the vertical bus bar. Thus, it is unlikely that a conducting cross-sectional area of the vertical bus bar is reduced due to forming of the flat bus bar portion, and a required conducting cross-sectional area can be advantageously ensured.

Specifically, a composite structure of the vertical bus bar and the flat bus bar is achieved in the present invention. Thereby, it is both achieved to downsize the electric junction box due to employment of the vertical bus bar and to secure the conducting cross-sectional area of the bus bar. Further, the flat bus bar is partially employed on the second opening side of the terminal connection holes in the relay mount portion in which a work space is required. Thereby, it is also achieved to ensure the work space.

Further, in addition to the connection terminal for the switch, a connection terminal for a coil side may also be provided to the flat bus bar portion in the present aspect. Thereby, the number of connection terminals and electric wires connected thereto can be reduced without using the bus bar, and thus the terminal connection work can further be simplified.

A second aspect of the present invention provides the electric junction box according to the first aspect, in which the terminal connection holes include an input terminal connection hole for a switch and input/output terminal connection holes for a coil, the input terminal connection hole for the switch being provided to a central portion of the relay mount portion, the input/output terminal connection holes for the coil being provided closer toward the vertical bus bar side than the input terminal connection hole for the switch, and being provided having a distance therebetween in a length direction of the vertical bus bar. The flat bus bar portion passes through between the second openings of the input/output terminal connection holes for the coil and extends to the second opening of the input terminal connection hole for the switch; the connection terminal for the switch is provided to an extended end edge portion of the flat bus bar portion; and the connection terminals for the coil are provided to a side end edge portion of the flat bus bar portion.

With the structure above, the connection terminals for the coil can also be included in the flat bus bar portion, in addition to the connection terminal for the switch. Thereby, a crimp terminal connected to a coil side terminal of a relay and an electric wire extending from the crimp terminal can be eliminated. Thus, the number of components can be reduced, and the terminal connection work can be simplified.

Further, the flat bus bar portion may be extended straight to the input/output terminal connection holes of the switch, by effectively utilizing a space between the second openings of the input/output terminal connection holes for the coil. Thereby, materials to form the bus bar can be reduced, and the structure can be simplified. Furthermore, since the flat bus bar portion constitutes the space between the second openings of the input input/output terminal connection holes for the coil, the vertical bus bar can be eliminated, the vertical bus bar projecting proximate to the second openings of the input input/output terminal connection holes for the coil to which a crimp terminal of an external wire is inserted. Thus, the terminal connection work can be further simplified.

A third aspect of the present invention provides the electric junction box according to the second aspect, in which a peripheral wall of one of the second openings of the input/output terminal connection holes for the coil are projected more externally than the flat bus bar portion.

With the structure above, even when water, such as rain water, enters inside the electric junction box, the peripheral walls of the second openings guide water drops to outside the electric junction box beyond the flat bus bar portion. Thereby, the water drops can be effectively prevented from contacting the flat bus bar portion. Further, the flat bus bar portion can also be positioned by using the peripheral walls of the second openings.

According to the present invention, the vertical bus bar is provided to the side of the relay mount portion. Further, the flat bus bar portion is extended from the vertical bus bar, and then the plurality of connection terminals are integrally provided to the flat bus bar portion. Thereby, a wide work space for mounting other connection terminals can be ensured on the second opening side of the terminal connection holes of the relay mount portion, with no projection of the vertical bus bar.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiments of the present invention are explained below with reference to the drawings.

Figure 1:
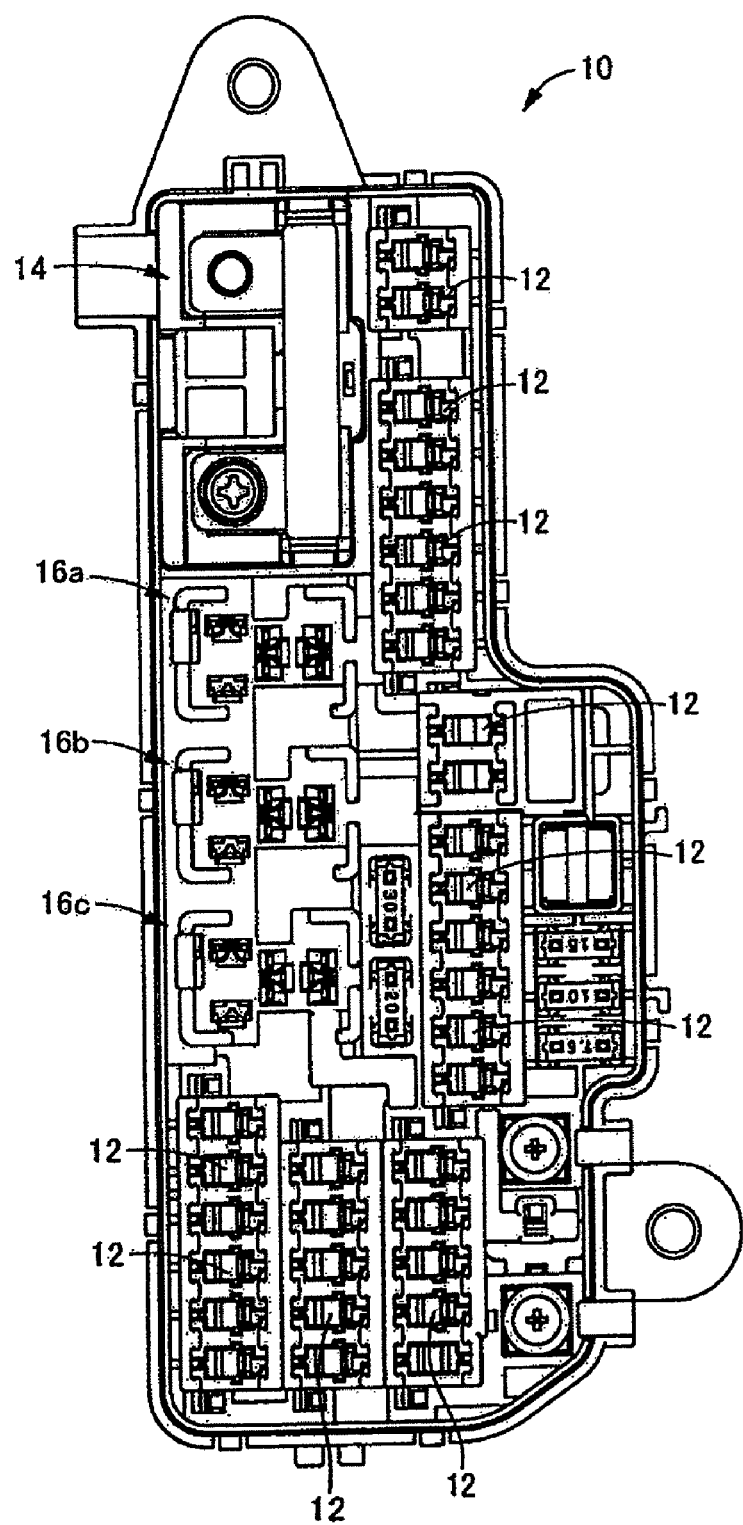
FIG. 1 is a front view of an electric junction box according to an embodiment of the present invention.

A front surface of an electric junction box 10 is first shown in FIG. 1, as an embodiment of the present invention. A rear surface of the electric junction box 10 is then shown in FIG. 2. The electric junction box 10 according to the present embodiment may be mounted to any suitable vehicle, such as a motorcycle, and has a longitudinal shape. The electric junction box 10 is provided with a plurality of fuse attachment portions 12 linearly aligned in a longitudinal direction of the electric junction box 10, and with a fusible link attachment portion 14 in a first end portion in the longitudinal direction.

Figure 3:
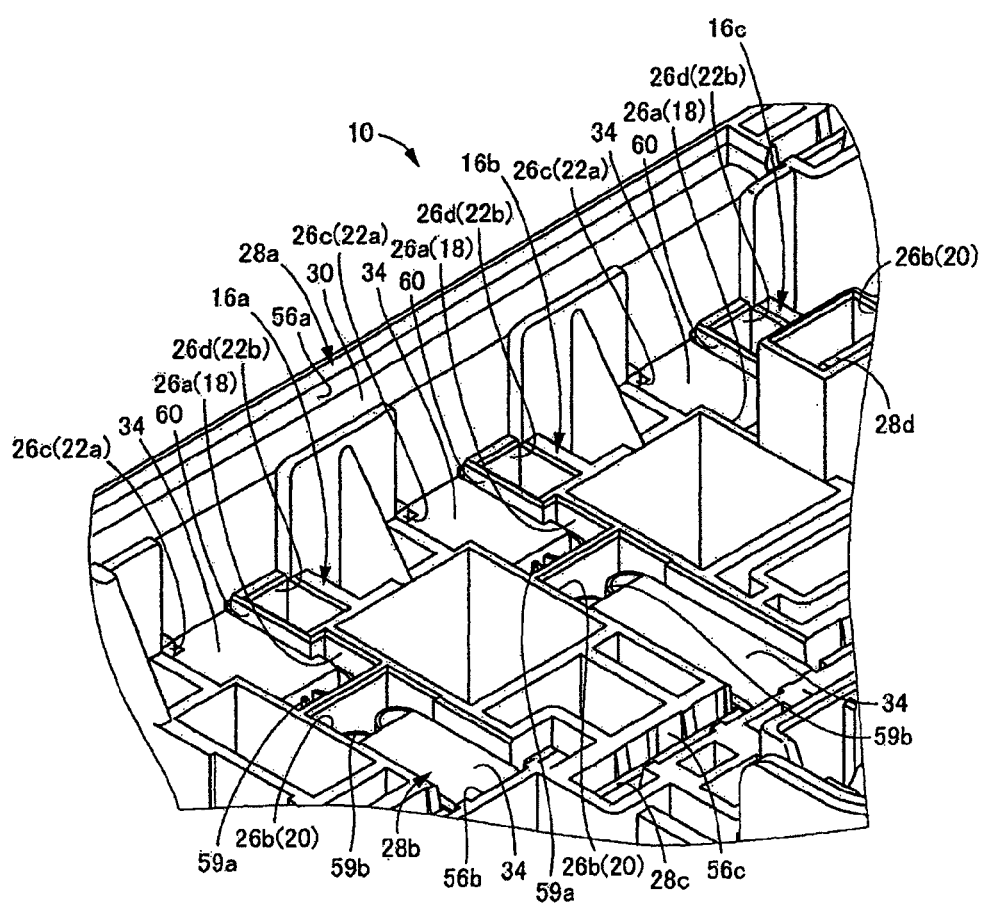
FIG. 3 is an enlarged perspective view of a major portion of a rear surface of the electric junction box shown in FIG. 1.
Figure 4:
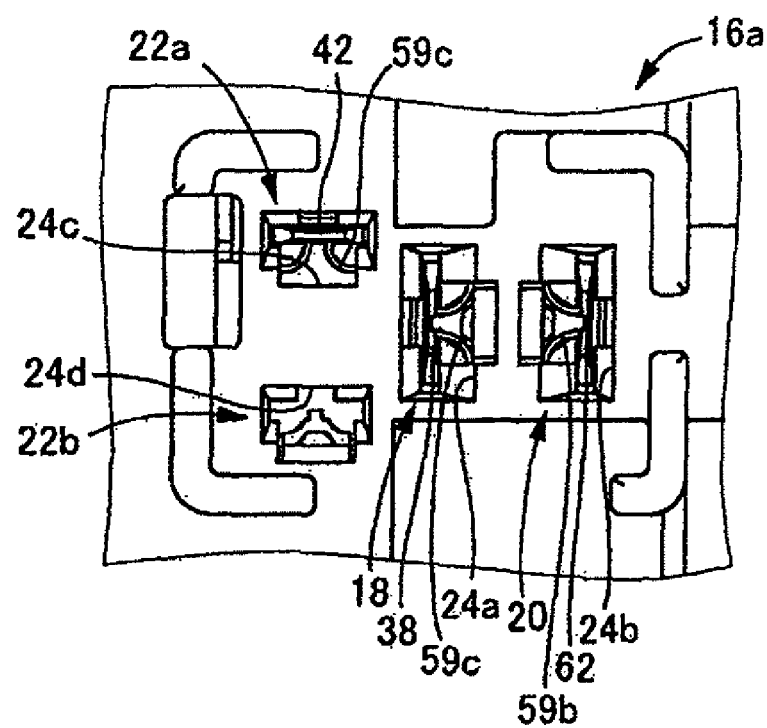
FIG. 4 is a front view of a relay mount portion of the electric junction box shown in FIG. 1.
Figure 5:
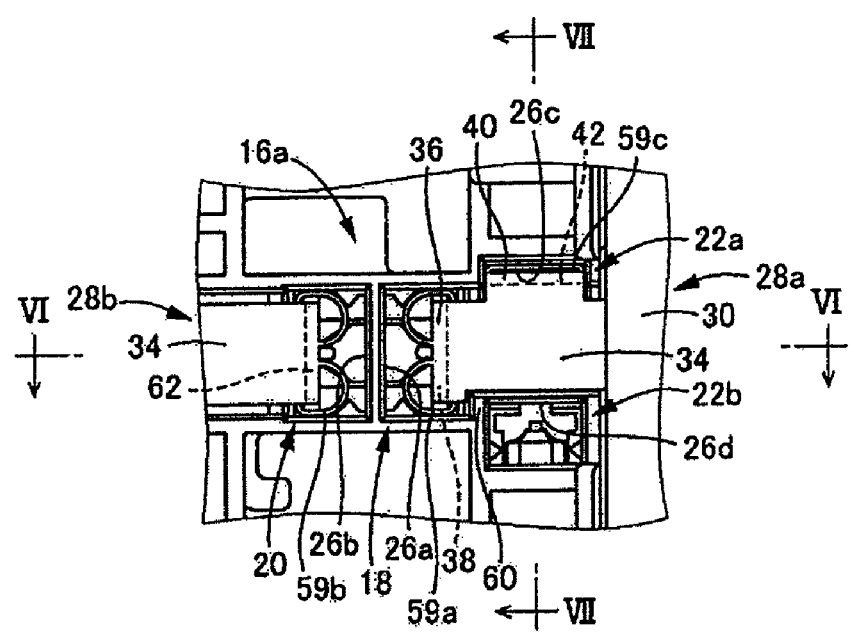
FIG. 5 is a rear view of the relay mount portion shown in FIG. 4.
Figure 6:
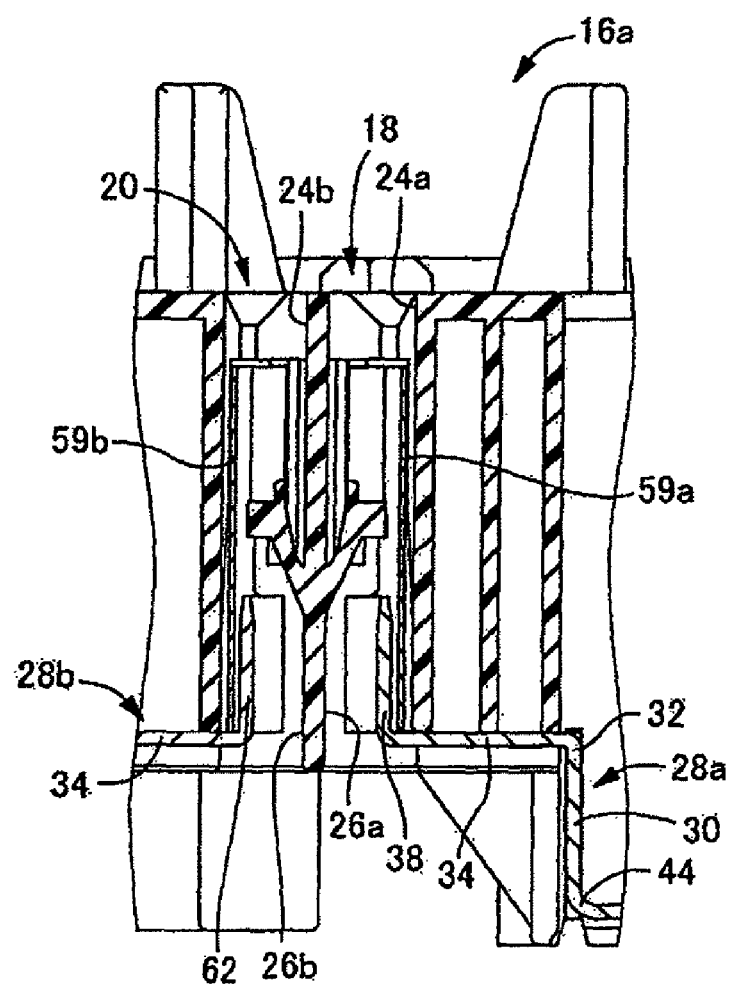
FIG. 6 is a cross-sectional view of the relay mount portion of FIG. 5 along line VI-VI.
Figure 7:
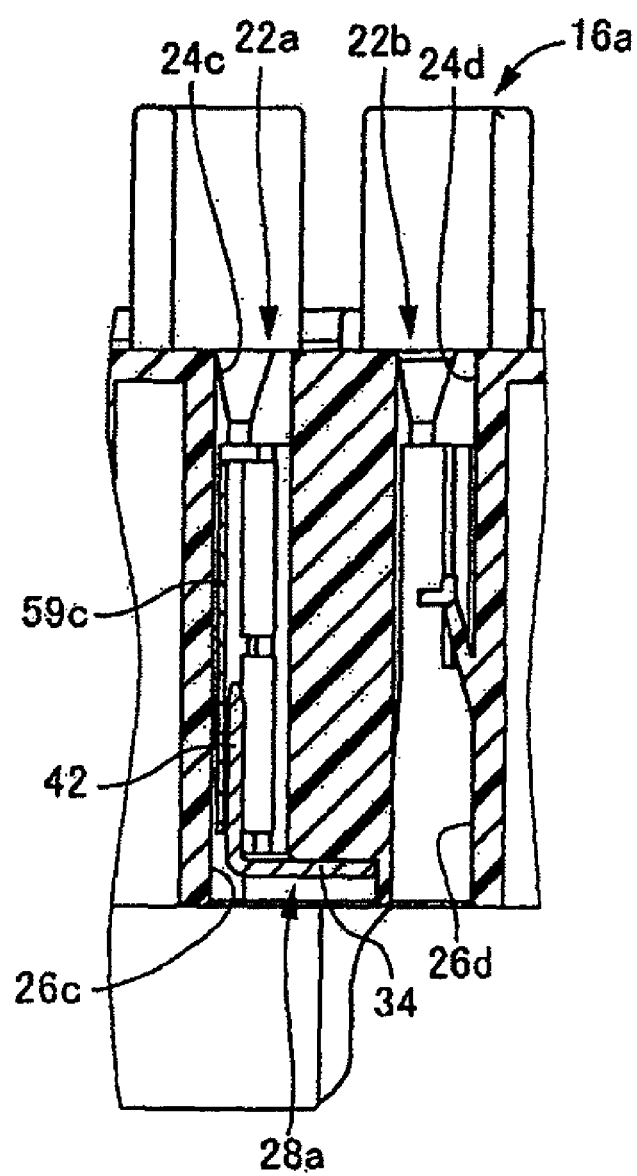
FIG. 7 is a cross-sectional view of the relay mount portion of FIG. 5 along line VII-VII.

As also shown in FIG. 3, three relay mount portions 16a to 16c are provided in a longitudinal middle portion of the electric junction box 10. Since the relay mount portions 16a to 16c have substantially a same structure, the relay mount portion 16a is explained below as an example.

The relay mount portion 16a is shown in FIGS. 4 to 7. The relay mount portion 16a is provided with an input terminal connection hole 18 for a switch, an output terminal connection hole 20 for the switch, and a pair of input/output terminal connection holes 22a and 22b for a coil. The terminal connection holes 18, 20, 22a, and 22b are longitudinal rectangular through-holes penetrating in a thickness direction of the electric junction box 10. The terminal connection holes 18, 20, 22a, and 22b have front side openings 24a to 24d, respectively, and rear side openings 26a to 26d, respectively, the front side openings 24a to 24d being first openings open to a front surface of the electric junction box 10, the rear side openings 26a to 26d being second openings open to a rear surface thereof.

The input terminal connection hole 18 for the switch is provided in substantially a middle portion of the relay mount portion 16a. The output terminal connection hole 20 for the switch is provided to an external side of the input terminal connection hole 18 for the switch. The input terminal connection hole 18 for the switch and the output terminal connection hole 20 for the switch, which have a longitudinal direction same as that of the electric junction box 10, are provided adjacently alongside each other orthogonal to the longitudinal direction of the electric junction box 10.

The input/output terminal connection holes 22a and 22b for the coil are provided on an opposite side of the output terminal connection hole 20 for the switch, having the input terminal connection hole 18 for the switch in between. In the present embodiment, the input/output terminal connection holes 22a and 22b for the coil are provided external to the electric junction box 10, relative to the input terminal connection hole 18 for the switch and the output terminal connection hole 20 for the switch. The input/output terminal connection holes 22a and 22b for the coil, which have a longitudinal direction orthogonal to the longitudinal direction of the input terminal connection hole 18 for the switch and the output terminal connection hole 20 for the switch, are provided alongside each other in the longitudinal direction of the electric junction box 10, having an appropriate distance in between.

Figure 8:
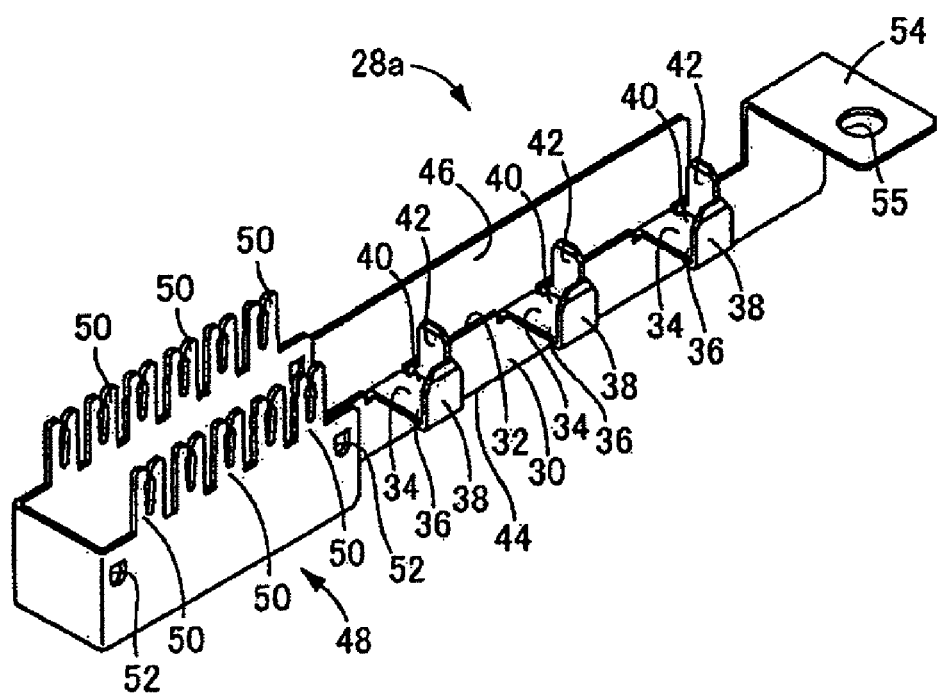
FIG. 8 is a perspective view of a vertical bus bar mounted in the electric junction box shown in FIG. 1.
Figure 9:
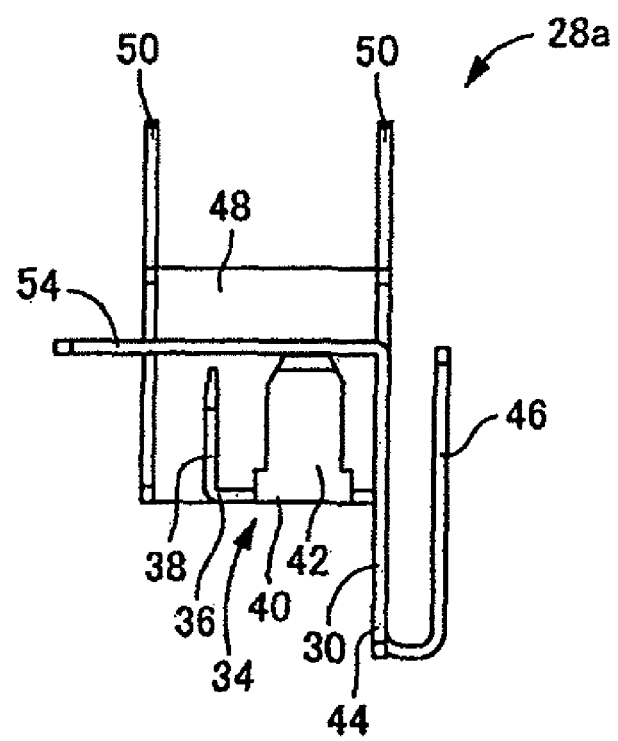
FIG. 9 is a side view of the vertical bus bar shown in FIG. 8.

On a side of the relay mount portion 16a to 16c, a vertical bus bar 28a is inserted from the rear side of the electric junction box 10. The vertical bus bar 28a is shown in FIGS. 8 and 9. The vertical bus bar 28a is provided with a bus bar main body 30 having a planar shape. Three flat bus bar portions 34 corresponding to the relay mount portions 16a to 16c are integrally provided to a first end edge portion 32 in a middle portion of the bus bar main body 30, the first end edge portion 32 being positioned on the front side of the electric junction box 10 when being housed therein. A projected piece projecting from the end edge portion 32 of the bus bar main body 30 is bent orthogonally, and thereby each of the flat bus bar portions 34 is provided extending from the end edge portion 32 substantially orthogonal to the bus bar main body 30.

Further, a projected piece projecting from an extended end edge portion 36 is folded in an opposite direction to an attachment direction of a relay (from upward to downward in FIG. 9), and thereby a connection terminal 38 for a switch is integrally provided to the extended end edge portion 36 of the flat bus bar portion 34, the connection terminal 38 projecting substantially orthogonal to the flat bus bar portion 34. Furthermore, a projected piece projecting from a side end edge portion 40 is folded in a same direction as the connection terminal 38 for the switch, and thereby a connection terminal 42 for a coil is integrally provided to a first side of the side end edge portion 40 of the flat bus bar portion 34.

In addition, a fitting piece portion 46 is integrally provided to the middle portion of the bus bar main body 30, the fitting piece portion 46 having an L-shaped cross section and projecting from an end edge portion 44 positioned on the rear side of the electric junction box 10 when being housed therein. The fitting piece portion 46 projects from the end edge portion 44 in an opposite direction of the flat bus bar portion 34. The projected end edge portion is folded in an opposite direction to the attachment direction of the relay. Thereby, the bus bar main body 30 and the fitting piece portion 46 provide substantially a square C shape from a cross-sectional view in the middle portion of the bus bar main body 30.

A square C-shaped portion 48 bent in a square C shape is provided to a first end portion of the bus bar main body 30. A plurality of pronged fuse connection terminals 50 are integrally provided projecting in an opposite direction to an attachment direction of fuses (from upward to downward in FIG. 9) to a pair of end portions 32 provided mutually opposite in the square C-shaped portion 48. Further, a plurality of engagement holes 52 are provided penetrating the square C-shaped portion 48. Furthermore, a plate attachment portion 54 is integrally provided to a second end portion opposite to the square C-shaped portion 48 of the bus bar main body 30, the plate attachment portion 54 being folded in a same direction as the flat bus bar portion 34. A bolt through-hole 55 is provided penetrating the plate attachment portion 54.

The vertical bus bar 28a having the structure above is inserted from the rear side of the electric junction box 10 to a slit-shaped bus bar attachment portion 56a, which is provided to an external side of the relay attachment portions 16a to 16c on the rear side of the electric junction box 10. Then, the engagement holes 52 are engaged with engagement hooks (not shown in the drawing) projecting inside the bus bar attachment portion 56a, and thereby the vertical bus bar 28a is housed in and attached to the electric junction box 10. Further, the plate attachment portion 54 is placed over a plate 58 provided to the electric junction box 10, and then is bolt fixed through the bolt through-hole 55.

When being attached to the electric junction box 10, the vertical bus bar 28a is provided extending in the longitudinal direction of the electric junction box 10 on an opposite side of the input terminal connection hole 18 for the switch, having in between the input/output terminal connection holes 22a and 22b for the coil of the relay attachment portions 16a to 16c. Thus, the input/output terminal connection holes 22a and 22b for the coil are provided having a distance in between in a length direction of the vertical bus bar 28a. In each of the relay mount portions 16a to 16c, the flat bus bar portion 34 passes through between the rear side openings 26c and 26d of the input/output terminal connection holes 22a and 22b for the coil, respectively, and extends to the rear side opening 26a of the input terminal connection hole 18 for the switch, as shown in an example of the relay mount portion 16a in FIG. 5. Concurrently, the connection terminal 38 for the switch provided to the flat bus bar portion 34 is inserted to the input terminal connection hole 18 for the switch from the rear side opening 26a, and then is connected to a relay terminal 59a provided inside the input terminal connection hole 18 for the switch. Meanwhile, the connection terminal 42 for the coil is inserted to an input side of the input/output terminal connection hole 22a for the coil from the rear side opening 26c, and then is connected to a relay terminal 59c provided inside the input side input/output terminal connection hole 22a for the coil. Further, the plurality of fuse connection terminals 50 provided to the square C-shaped portion 48 of the vertical bus bar 28a are inserted to the respective fuse attachment portions 12 (details not shown in the drawing).

As also shown in FIG. 3, when the vertical bus bar 28a is attached to the electric junction box 10, the flat bus bar portion 34 is provided in a state exposed to the rear side of the electric junction box 10. Concurrently, an opening peripheral wall 60 of the rear side opening 26d of an output side input/output terminal connection hole 22b for the coil is projected more than the flat bus bar portion 34 perpendicularly downward (upward in FIG. 3) of the electric junction box 10.

Figure 2:
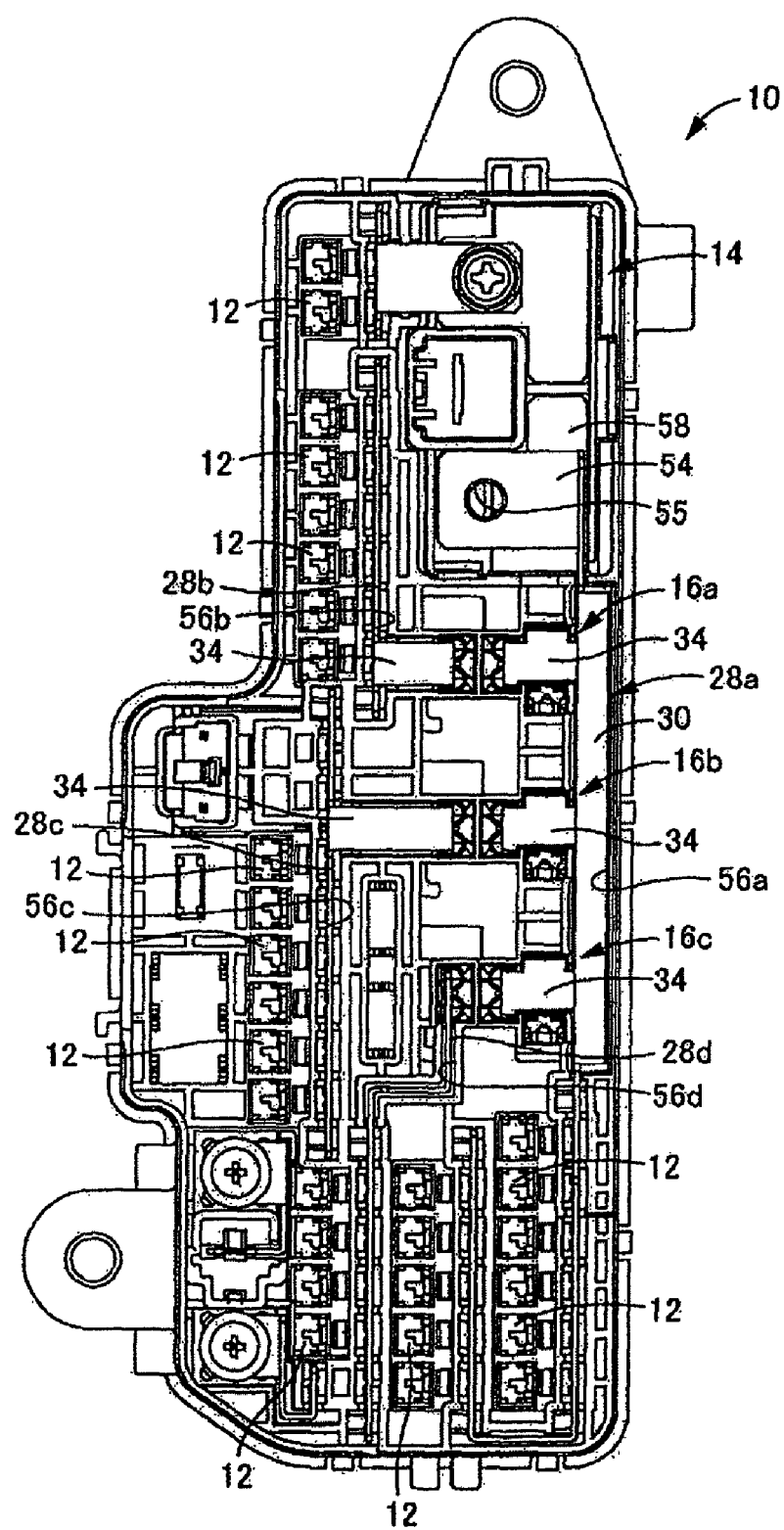
FIG. 2 is a rear view of the electric junction box shown in FIG. 1.

As shown in FIGS. 2 and 3, bus bar attachment portions 56b to 56d are provided to the rear side of the electric junction box 10 on an opposite side to the bus bar attachment portion 56a, having the relay mount portions 16a to 16c in between. Similar to the vertical bus bar 28a, vertical bus bars 28b to 28d are inserted and fixed to the bus bar attachment portions 56b to 56d from the rear side of the electric junction box 10. A connection terminal 62 for the switch (refer to FIG. 5) provided to the vertical bus bars 28b to 28d is inserted from the rear side opening 26b to the output terminal connection hole 20 for the switch of each of the relay mount portions 16a to 16c, and then is connected to a relay terminal 59b provided inside the output terminal connection hole 20 for the switch. In particular, the flat bus bar portion 34 substantially similar to the vertical bus bar 28a is provided to the vertical bus bars 28b and 28c. The connection terminal 62 for the switch, which is formed by bending an extended end portion of the flat bus bar portion 34, is inserted to the output terminal connection hole 20 for the switch of each of the relay mount portions 16a and 16b. Further, a plurality of pronged fuse connection terminals (not shown in the drawing) are integrally provided to the vertical bus bars 28b to 28d. The fuse connection terminals are inserted in the respective fuse attachment portions 12 from the rear side of the electric junction box 10.

A relay (not shown in the drawing) is mounted to the relay mount portions 16a to 16c from the front side of the electric junction box 10 having the structure above. Thereby, an input terminal for a switch of the relay is inserted to the input terminal connection hole 18 for the switch from the front side opening 24a, and then is connected to the connection terminal 38 for the switch of the vertical bus bar 28a through the relay terminal 59a. An input terminal for a coil of the relay is inserted to the input side input/output terminal connection hole 22a for the coil from the front side opening 24c, and then is connected to the connection terminal 42 for the coil of the vertical bus bar 28a through the relay terminal 59c.

In addition, an output terminal for the switch of the relay is inserted to the output terminal connection hole 20 for the switch from the front side opening 24b, and then is connected to the connection terminal 62 for the switch of the vertical bus bars 28b to 28d through the relay terminal 59b. Further, an output terminal for the coil of the relay is inserted to the output side input/output terminal connection hole 22b for the coil from the front side opening 24d. A connection terminal provided to an external wiring terminal (not shown in the drawing) is then inserted from the rear side opening 26d of the input/output terminal connection hole 22b, and connected to the output terminal for the coil of the relay.

In the present embodiment, the vertical bus bar 28a is provided to the side of the relay mount portions 16a to 16c, and the flat bus bar portion 34 extending from the bus bar main body 30 is provided between the input/output terminal connection holes 22a and 22b for the coil. Thereby, the vertical bus bar 28a is not projected in the middle portion of each of the relay mount portions 16a to 16c, and thus a wide work space is ensured. Consequently, it is simply performed to insert a connection terminal of an external wire to the output side input/output terminal connection hole 22b for the coil. In the relay mount portions 16a and 16b in particular, the connection terminal 62 for the switch to be inserted into the output terminal connection hole 20 for the switch is also provided to the flat bus bar portion 34 of the vertical bus bars 28b and 28c. The vertical bus bars 28b and 28c are thus prevented from projecting in the relay mount portions 16a and 16b, and thus a further wide work space is ensured.

In addition, a projected piece from the bus bar main body 30 is bent, and thereby the flat bus bar portion 34 is provided with no reduction in a cross-sectional area of the bus bar main body 30. Thus, a conducting cross-sectional area required for the bus bar main body 30 can be advantageously ensured. Since the bus bar main body 30 is vertically inserted into the electric junction box 10, downsizing by the bus bar main body 30 and ensuring of the work space by the flat bus bar portion 34 can both be achieved in a sophisticated manner. Further, the connection terminal 42 for the coil is provided to the flat bus bar portion 34 in addition to the connection terminal 38 for the switch. Thereby, the number of electric wires to be connected to the electric junction box 10 can be reduced, and thus wire connection work can further be simplified.

Furthermore, the flat bus bar portion 34 is exposed to the rear side of the electric junction box 10, and thus heat dissipation efficiency can be improved. The opening peripheral wall 60 of the rear side opening 26d of the output side input/output terminal connection hole 22b for the coil is projected perpendicularly more downward than the flat bus bar portion 34. Thus, even when water, such as rain water, enters inside the electric junction box 10, water drops can be dropped from the opening end edge portion of the opening peripheral wall 60, and thus it is unlikely that the exposed flat bus bar portion 34 get wet. Further, the flat bus bar portion 34 can be easily positioned by using the opening peripheral wall 60.

The embodiment of the prevent invention is explained in detail above. The present invention, however, is not limited by specifics in the explanation. For instance, a specific number of the relay mount portions and the vertical bus bars, and placement thereof on the electric junction box are not limited to those shown, but rather any suitable number and suitable any placement may be provided. In this regard, a plurality of relay mount portions may be provided in a plurality of rows, and a vertical bus bar may be provided per row.

In the embodiment above, the flat bus bar portion is projected straight from the vertical bus bar. The flat bus bar portion may be provided bent on a projected flat surface from the vertical bus bar, for instance.

It is noted that the foregoing examples have been provided merely for the purpose of explanation and are in no way to be construed as limiting of the present invention. While the present invention has been described with reference to exemplary embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular structures, materials and embodiments, the present invention is not intended to be limited to the particulars disclosed herein; rather, the present invention extends to all functionally equivalent structures, methods and uses, such as are within the scope of the appended claims.

The present invention is not limited to the above described embodiments, and various variations and modifications may be possible without departing from the scope of the present invention.

What is claimed is:

1. An electric junction box comprising:
   a relay mount portion having a plurality of terminal connection holes, relay terminals being inserted in first openings of the terminal connection holes, and connection terminals being inserted in second openings of the terminal connection holes, to make connection to the relay terminals; and
   a vertical bus bar provided to a side of the relay mount portion; a flat bus bar portion extending integrally from an end edge portion of the vertical bus bar to the second openings of the terminal connection holes; the connection terminals being integral with the flat bus bar portion, and the connection terminals including a connection terminal for a switch.

2. The electric junction box according to claim 1, wherein the terminal connection holes include an input terminal connection hole for a switch and input/output terminal connection holes for a coil, the input terminal connection hole for the switch being provided to a central portion of the relay mount portion, the input/output terminal connection holes for the coil being provided closer to the vertical bus bar side than the input terminal connection hole for the switch, and having a distance therebetween in a length direction of the vertical bus bar; and the flat bus bar portion passes between the second openings of the input/output terminal connection holes for the coil and extends to the second opening of the input terminal connection hole for the switch; the connection terminal for the switch is provided to an extended end edge portion of the flat bus bar portion; and the connection terminals for the coil are provided to a side end edge portion of the flat bus bar portion.

3. The electric junction box according to claim 2, wherein a peripheral wall of one of the second openings of the input/output terminal connection holes for the coil projects externally further than the flat bus bar portion.

* * * * *